United States Patent
Ogliari et al.

(10) Patent No.: US 11,834,753 B2
(45) Date of Patent: Dec. 5, 2023

(54) REACTOR FOR EPITAXIAL DEPOSITION WITH A HEATING INDUCTOR WITH MOVABLE TURNS

(71) Applicant: LPE S.p.A., Baranzate (IT)

(72) Inventors: Vincenzo Ogliari, Baranzate (IT); Silvio Preti, Baranzate (IT); Franco Preti, Baranzate (IT)

(73) Assignee: LPE S.p.A., Baranzate (IT)

( * ) Notice: Subject to any disclaimer, the term of this patent is extended or adjusted under 35 U.S.C. 154(b) by 0 days.

(21) Appl. No.: 17/371,973

(22) Filed: Jul. 9, 2021

(65) Prior Publication Data

US 2021/0332498 A1 Oct. 28, 2021

Related U.S. Application Data

(62) Division of application No. 16/347,251, filed as application No. PCT/IB2017/056720 on Oct. 30, 2017, now abandoned.

(30) Foreign Application Priority Data

Nov. 4, 2016 (IT) .......................... 102016000111143

(51) Int. Cl.
    *C30B 35/00* (2006.01)
    *C30B 25/10* (2006.01)
    *C23C 16/46* (2006.01)
    *C23C 16/52* (2006.01)

(52) U.S. Cl.
    CPC .............. *C30B 25/10* (2013.01); *C23C 16/46* (2013.01); *C23C 16/52* (2013.01)

(58) Field of Classification Search
    CPC ......... C30B 25/00; C30B 25/02; C30B 25/10; C30B 25/12; C30B 25/16; C30B 35/00; C30B 35/007; C23C 16/46; C23C 16/52
    USPC ... 117/84–86, 88–89, 105–106, 20–202, 204
    See application file for complete search history.

(56) References Cited

U.S. PATENT DOCUMENTS

| 3,958,664 | A | * | 5/1976 | Perkins | .................... | B66F 7/025 |
| | | | | | | 187/214 |
| 4,875,782 | A | * | 10/1989 | Fox | ........................ | G01K 1/146 |
| | | | | | | 73/204.11 |
| 6,705,394 | B1 | * | 3/2004 | Moslehi | ............ | H01L 21/67248 |
| | | | | | | 118/724 |

(Continued)

FOREIGN PATENT DOCUMENTS

| CN | 101667525 A | 3/2010 |
| CN | 102359694 A | 2/2012 |

(Continued)

*Primary Examiner* — Kenneth A Bratland, Jr.
(74) *Attorney, Agent, or Firm* — Dickinson Wright PLLC; Andrew D. Dorisio

(57) ABSTRACT

The present invention relates to a heating method for a reactor (1) for epitaxial deposition; the reactor (1) comprises a susceptor (2) and an inductor (4); the inductor (4) is adapted to heat the susceptor (2) by electromagnetic induction when it is electrically powered; the inductor (4) comprises a plurality of turns (41-47); during heating of the susceptor (2) from a first temperature to a second temperature, the position of one or more turns (43) of the inductor (4) with respect to the susceptor (2) and to the other turns of the inductor (4) is changed. The turns (43) are actuated by means of an appropriate actuation system (61, 62, 63).

4 Claims, 3 Drawing Sheets

(56) References Cited

U.S. PATENT DOCUMENTS

Figure 1:
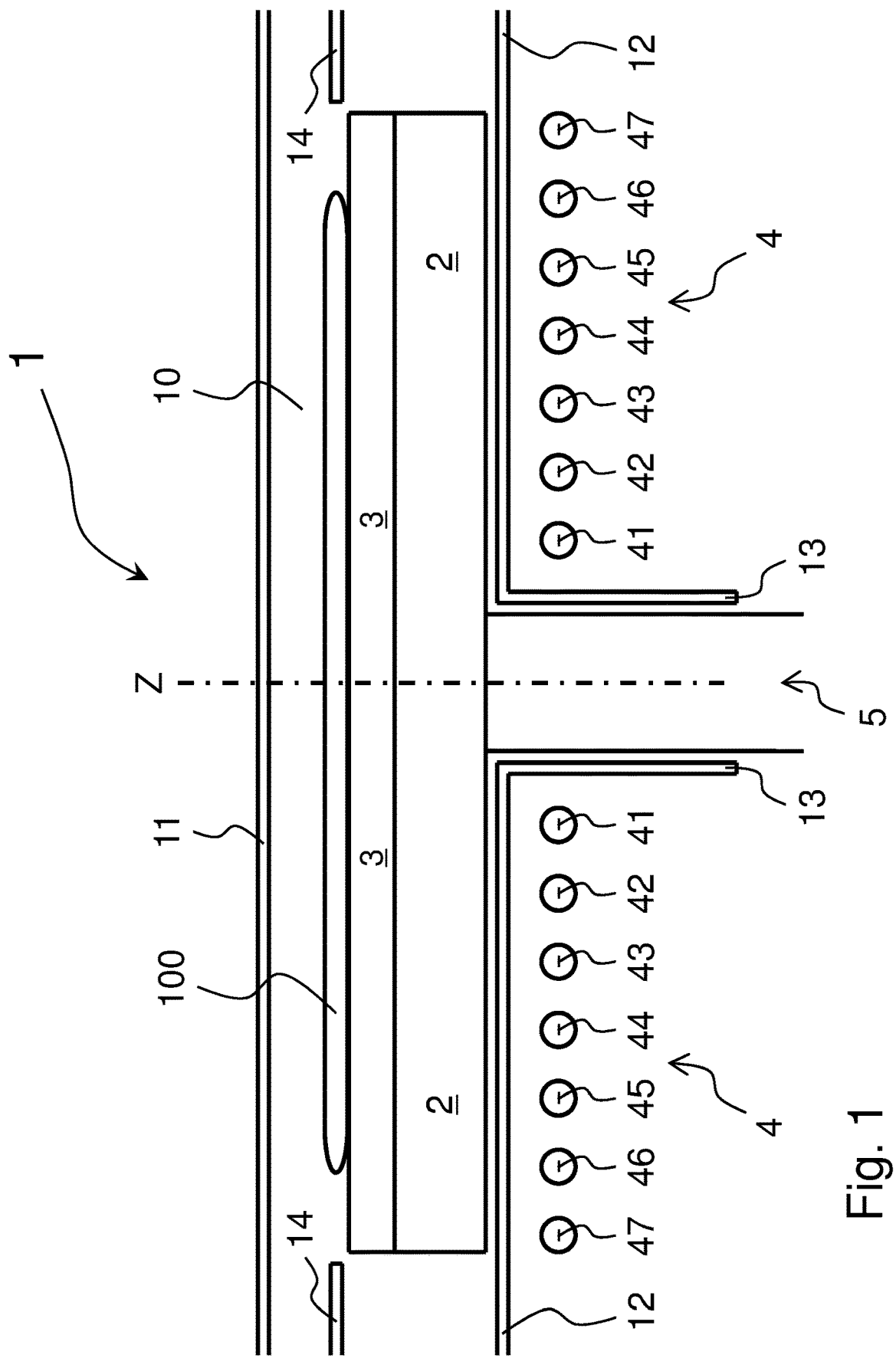

2003/0029381 A1\* 2/2003 Nishibayashi .......... C23C 16/52
118/712

FOREIGN PATENT DOCUMENTS

| CN | 102560436 A | 7/2012 |
|----|-------------|--------|
| JP | S60207331 A | 10/1985 |

\* cited by examiner

REACTOR FOR EPITAXIAL DEPOSITION WITH A HEATING INDUCTOR WITH MOVABLE TURNS

This application is a divisional of U.S. Ser. No. 16/347,251, which is a national stage of PCT/IB2017/056720, which claims priority to Italian patent application no. 102016000111143, the disclosures of which are all incorporated by reference.

DESCRIPTION

Field of the Invention

The present invention relates to a heating method for a reactor for epitaxial deposition and a reactor for epitaxial deposition.

State of the Art

Any epitaxial reactor comprises a heating system to heat the substrates to be subjected to epitaxial growth.

A phase of an epitaxial deposition process is preceded by a heating phase and it is followed by a cooling phase.

Heating can be, for example, of the electromagnetic induction type.

Often, in this case, the heating system directly heats a susceptor (which is located inside the reaction chamber of the epitaxial reactor), and the substrates receive heat by conduction from the susceptor (which supports them).

Always, in this case, the heating system comprises at least one inductor.

In the past, the present Applicant had provided the possibility that one or more of the turns of such an inductor be movable: the patent document WO9610659A2.

According to this solution, the inductor consisted of a plurality of rigid circles connected electrically and mechanically by flexible bridges; a single circle was moved by means of a single electric motor and a single translating actuator mounted on the shaft of the motor; the deformation caused by said actuator was entirely borne by the flexible bridges.

The turns were positioned in desired positions before starting the heating operation and hence well before starting epitaxial deposition; this positioning was one of the operations of the initial setting of the reactor.

Solutions of this kind are also known from the patent documents with publication number US2010059182, JP2003133245 and KR100978567.

The main objective of a heating system for epitaxial reactor was and is to obtain a uniform temperature of the substrate during the process.

A secondary objective of a heating system for epitaxial reactor was and is to reach the process temperature in a short time.

According to the solution known from the patent document having publication number JP2003133245, an entire inductor is approached to a susceptor to heat it more rapidly before an epitaxial deposition process and to move an entire inductor away from a susceptor to cool it more rapidly after an epitaxial deposition process.

SUMMARY

The Applicant has realised, through experiments that it conducted, that it is very advantageous for the temperature of the substrate to be uniform not only during the process, but also during heating, or, rather, instant by instant during heating that precedes the epitaxial deposition process; the advantage can be tied, for example, to the reduction of thermal stresses and defects, in particular "slip lines".

The Applicant then set itself the objective of providing a solution that makes it possible to obtain a uniform temperature of the substrate both during heating and during the subsequent epitaxial deposition.

The Applicant also set itself the objective of providing a solution that makes it possible to reach the process temperature in a short time.

Lastly, the Applicant has set itself the objective of provide a solution that is not only effective, but also simple.

These objectives are substantially achieved thanks to the heating method and to the reactor for epitaxial reactor having the technical features set forth in the accompanying claims.

LIST OF FIGURES

Figure 2:
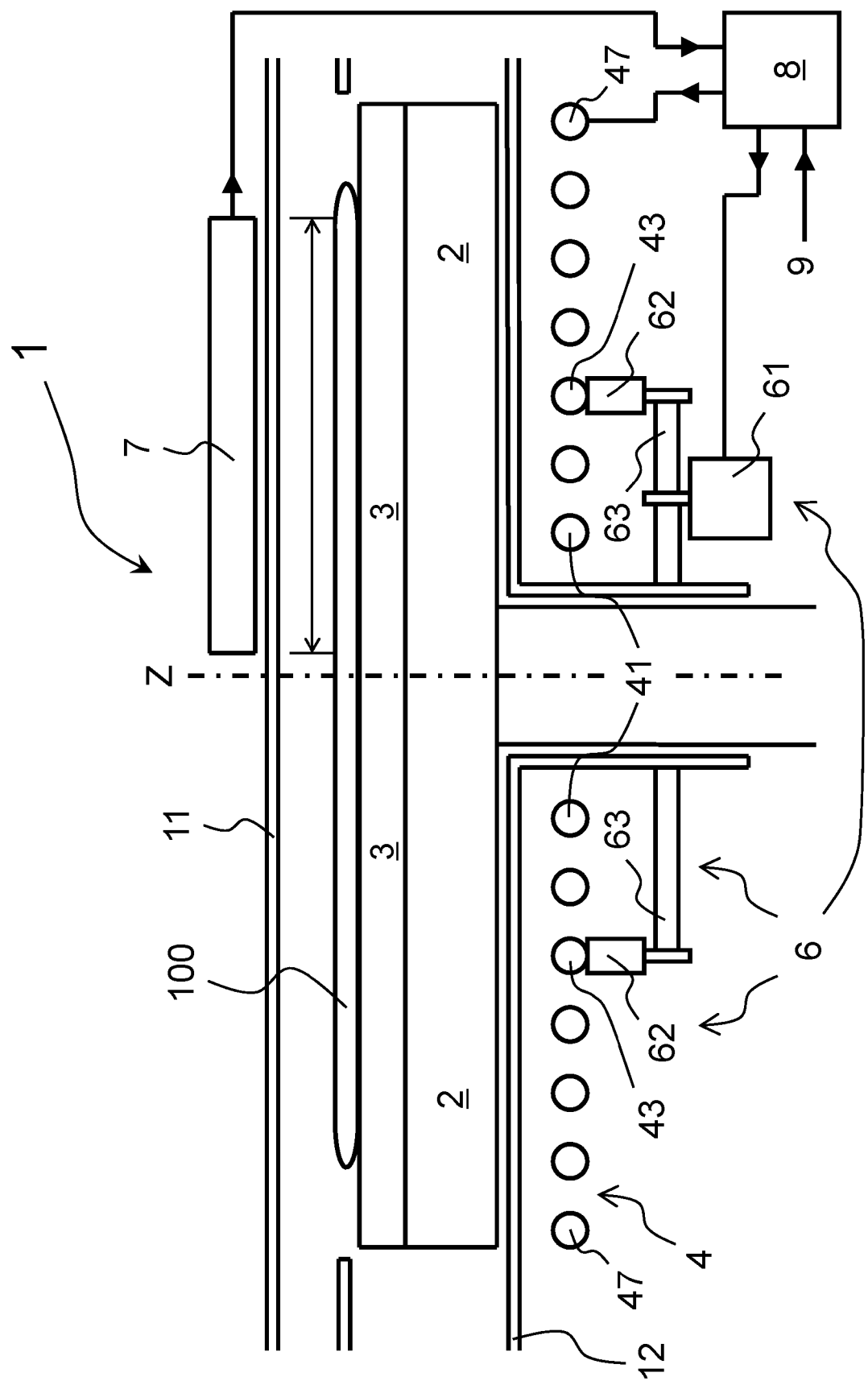
Figure 3:
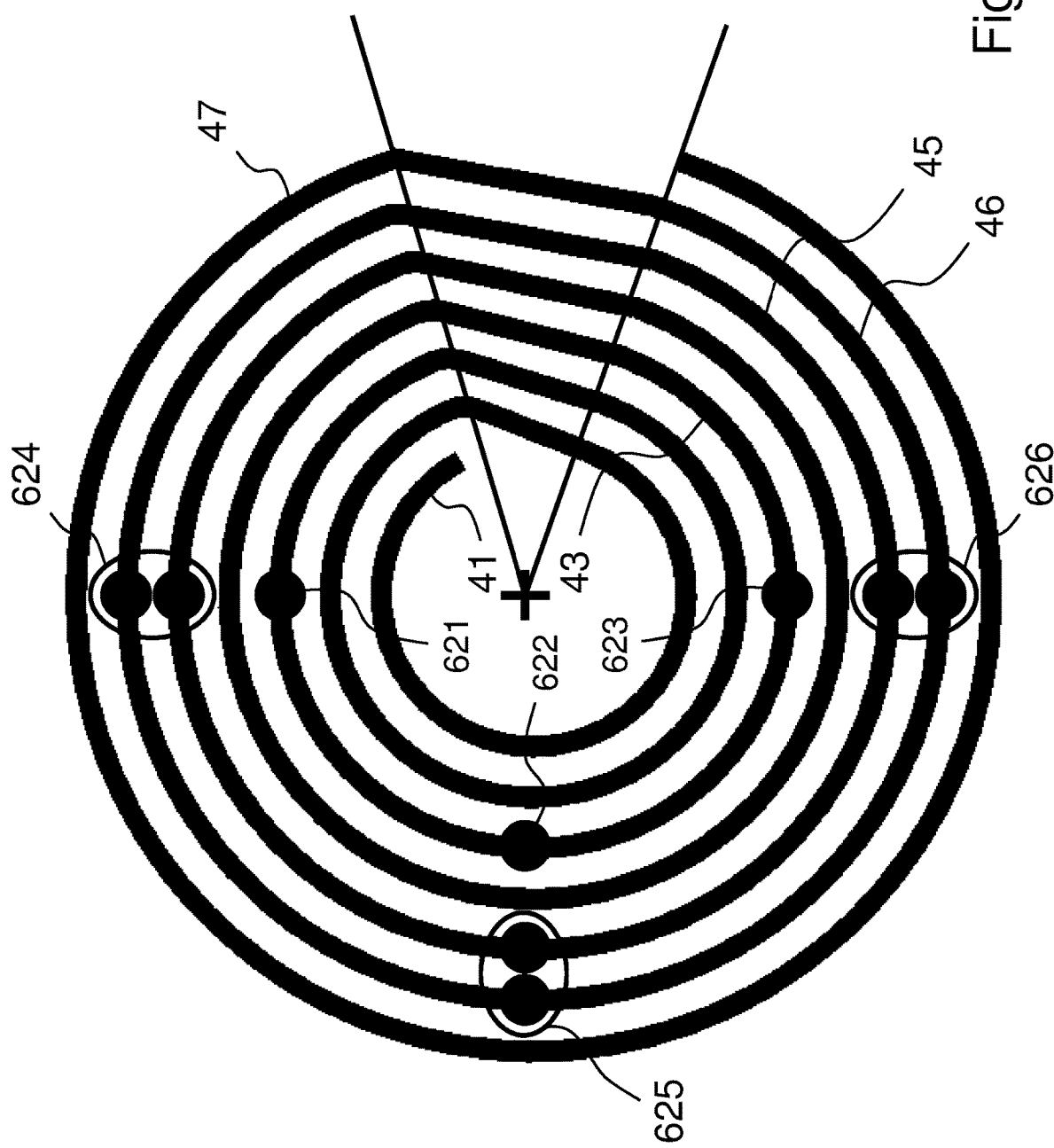

The present invention shall become more readily apparent from the detailed definition that follows to be considered together with the accompanying drawings in which:

FIG. 1 shows a vertically sectioned schematic view of a reaction chamber of an embodiment of an epitaxial reactor according to the prior art, FIG. 2 shows a vertically sectioned schematic view of a reaction chamber of an embodiment of an epitaxial reactor according to the present invention, and FIG. 3 schematically shows a top view of an inductor of the reactor of FIG. 2.

As is easily understandable, there are various way of implementing in practice the present invention which is defined in its main advantageous aspects in the appended claims.

DETAILED DESCRIPTION

FIG. 1 shows a vertically sectioned schematic view of a reaction chamber of an embodiment of an epitaxial reactor 1 according to the prior art.

The reaction chamber is provided with a cavity 10 defined by an upper wall 11 (in particular made of transparent quartz), a lower wall 12 (in particular made of transparent quartz) and lateral walls (in particular made of transparent quartz) not shown in the figure.

A susceptor 2 is positioned within the cavity 10 and it is adapted to support and heat substrates during epitaxial deposition. In the case of FIG. 1, there is a single substrate 100 that is laid on a support element 3 (with disk-like shape, specifically of a cylinder with far smaller height than diameter, positioned horizontally and made of graphite which may be coated with SiC or TaC) which, in turn, is laid on the susceptor 2 (with disk-like shape, specifically of a cylinder with far smaller height than diameter, positioned horizontally and made of graphite which may be coated with SiC or TaC), the element 3 is not indispensable for the purposes of the present invention.

A heating system is provided that comprises at least one inductor 4 adapted to heat the susceptor 2 by electromagnetic induction when it is supplied electrical power; the inductor 4 is flat and it comprises a plurality of turns 41-47 (in particular seven concentric turns in the example of FIG. 1), typically connected electrically in series. The system can comprise other inductors under the chamber, but, typically, nothing over the chamber.

Inside the cavity 10 are horizontal inner walls 14 aligned to the substrate 100.

The susceptor 2 is fastened to a rotating shaft 5 around a vertical axis Z.

The lower wall 12 has a hole and a sleeve 13 for the passage of the shaft 5.

The inductor 4 is situated under the lower wall 12 around the sleeve 13.

The embodiment of FIG. 2 is an improvement of the solution of FIG. 1 or of similar solutions.

In FIG. 2, some components of an actuation system 6 to move the turns of the inductor 4 are seen: an electric motor 61, a pair of actuators 62 with a corresponding pair of potentiometers (not shown in the figure), and a transmission 63.

In FIG. 2, a thermographic camera 7 is shown, located above the upper wall 11 adapted to measure temperature in the chamber, in particular of the substrate 100, in a thin underlying radial area; in particular, the radial area extends between the axis Z (or very close thereto) and the edge of the substrate 100 (or very close thereto); this measurement area is sufficient because the susceptor and the substrate rotate.

In FIG. 2, a computerised heating control system is shown; it can comprise one or more PLCs. The system 8 is connected electrically: to the inductor 4 to supply power to it, to the system 6 (in particular, to the motor 61 and to the potentiometers), to the thermographic camera 7, and a user interface 9. The interface 9 allows an operator to enter commands and to extract information.

In FIG. 3, the exemplifying case in which the turns 43, 45 and 46 are movable is shown schematically; the turns 45 and 46, which constitute for example a "group", are moved by the system 6 together with and independently from the turns 43; the movement of the turn 43 is obtained by means of three actuators 621, 622 and 623 situated, for example, 90° from each other; the movement of the group of turns 45 and 46 is obtained by means of three pairs of actuators situated, for example, 90° from each other, or of three actuators 624, 625 and 626 (an actuator simultaneously moves two points of two turns, as in the figure). In FIG. 2, for greater clarity of the drawing, only parts of the devices that allow to move the turn 43 are shown, and none of the devices that allow to move the turns 45 and 46 is shown.

In FIG. 3, each of the turns has the shape of an arc of a circle, for example of approximately 330°, and the turns are jointed together for example by a rectilinear segment.

According to the present invention, the reactor (1 in FIG. 2) comprises an inductor (4 in FIG. 2) with turns (41-47 in FIG. 2), that is typically flat (or substantially flat), adapted to heat a susceptor (2 in FIG. 2) and to be controlled by modification of the position of one or more turns (41-47 in FIG. 2).

The reactor (1 in FIG. 2) comprises and actuation system that comprises:
- a first motor (61 in FIG. 2) (in particular an electric motor) adapted to modify the position (preferably, only the axial, i.e. vertical position) of at least one first turn (43 in FIG. 2) of the inductor (4 in FIG. 2) by effect of a motion thereof,
- a first plurality of translating actuators (62 in FIG. 2) adapted to act on a corresponding plurality of points (see both FIG. 2 and FIG. 3) of the first turn (43 in FIG. 2) and causing translations thereof (preferably only the axial, i.e. vertical translation), and
- a first transmission (63 in FIG. 2) (in particular a mechanical transmission adapted to transmit the motion of the first motor (61 in FIG. 2) to the first plurality of actuators (62 in FIG. 2).

Hence, it is possible that a turn (or a group of turns) of the inductor can be moved independently of the other turn.

It is possible that two turns (or two groups of turns) of the inductor can be moved independently of each other and of the other turn.

In this case, the actuation system further comprises:
- a second motor (in particular an electric motor) adapted to modify the position (preferably, only the axial, i.e. vertical position) of at least one second turn of the inductor by effect of a motion thereof,
- a second plurality of translating actuators adapted to act on a corresponding plurality of points of the second turn and cause translations thereof (preferably only the axial, i.e. vertical translations), and
- a second transmission (in particular a mechanical transmission) adapted to transmit the motion of the second motor to the second plurality of actuators.

In general and typically, there are several turns (or groups of turns) of the inductor that can move independently of each other and of the other turns.

As shown schematically in FIG. 3, the first and/or the second motor can be adapted to modify the position of a group of turns (for example, the turns 45 and 46) of the inductor with respect to the susceptor (2 in FIG. 2) and with respect to the other turns of the inductors.

The first transmission (63 in FIG. 2) and/or the second transmission consists of one and/or two belts or chains; the belts are preferably toothed.

The inductor (4 in FIG. 2 and FIG. 3) preferably consists of a continuous conductor made of a single mechanical piece; said mechanical piece must be sufficiently elastic, i.e. not rigid, to allow translating a turn thereof in axial direction without causing appreciable displacement of the adjacent turns; the reason is that the deformation caused by the actuators is distributed along the entire length of the turn.

Each actuator (62 in FIG. 2) transforms rotations received from a motor, through a transmission, into translations. It is preferable to measure the actual translations of an actuator to be certain of the positioning of the corresponding turns; for this purpose, it is advantageous to associate a simple potentiometer with an actuator and precisely to measure the rotations that it effects which correspond to translations that it generates. Then the reactor is put in place, it will be necessary to calibrate the actuators mechanically and the potentiometers electrically.

The system 8 is then able to drive a motor as provided by one or more control laws and to verify that a turn (more precisely, its points) has moved as desired.

The function of the computerised system 8 is, inter alia, to control the heating of the reactor 1 as well as to control the cooling of the reactor 1.

The system 8 can comprise means, in particular hardware means and software means, able specifically to implement the heating method according to the present invention that will be described below.

According to the heating method according to the present invention, during the heating of the susceptor (2 in FIG. 2), from a first temperature to a second temperature, and before a process of epitaxial deposition, the position of at least one first turn (43 in FIG. 2), or of a first group of turns, of the inductor (4 in FIG. 2) with respect to the susceptor and with respect to the other turns of the inductor (4 in FIG. 2) is modified; typically, the second temperature is higher than the first temperature.

In many cases, it will be advantageous that during the heating of the susceptor, from the first temperature to the second temperature, and before a process of epitaxial deposition, the position of at least one second turn, or of a second group of turns, of the inductor with respect to the susceptor and with respect to the other turns of the inductor (4 in FIG. 2) is changed.

The change in position of the second turn will typically be independent from the change in position of the first turn.

The change in position can be a single one during said heating, but, more typically, the position will be change repeatedly.

In this way, it is possible to try to have all the substrate at constant temperature even during temperature transitions. For example, at the start, all at 25° C., after one minute all at 50° C., after another minute all at 75° C., after another minute all at 100° C., after another minute all at 100° C., . . . , at the end all at 1150° C.; thereafter, during the period of the epitaxial deposition, all at 1150° C. It should be noted that, to obtain temperature uniformity during temperature transitions, it will be necessary to take into account the thermal inertia of the susceptor. According to this example, to each temperature interval of the transition (25-50° C., 50-75° C., 75-100° C., . . . , 1125-1150° C.) could be associated a position for each of the turns of the inductor.

The first temperature mentioned previously can be for example between 0° C. and 50° C., i.e. "ambient temperature", or it can be between 100° C. and 300° C., i.e. "loading temperature"; depending on the reactors, it is possible to load a) one or more substrates or b) one or more supporting elements with one or more substrates or c) a susceptor with one or more substrates.

The second temperature mentioned above can be between 500° C. and 2000° C., i.e. "process temperature" of a process of epitaxial deposition.

In general, one or more turns will appropriately and repeatedly modify their position (moving them away from or approaching them to the susceptor) during the entire heating period of the reactor from the first temperature to the second temperature so that the temperature of the upper face of the susceptor and of the supported substrates is uniform preferably instant by instant during the entire heating period.

Alternatively, one or more turns will appropriately and repeatedly modify their position (moving them away from or approaching them to the susceptor) only in a temperature range between the first temperature and the second temperature. For example, if the first temperature is the "ambient temperature" (for example 25° C.) or the "loading temperature" (for example 150° C.) and if the second temperature is the "process temperature" (for example 1150° C.), one or more turns will appropriately and repeatedly modify their position for example only in the temperature interval between 500° C. and the "process temperature"; in other words, the position of no turn will be modified in the temperature interval between the "ambient temperature" or the "loading temperature" and, for example, 500° C. This alternative can be useful, for example, in the cases in which a certain temperature inconsistency of the substrate in certain conditions is tolerable.

The geometry (in particular flat) of the inductor has a correspondence with the geometry (cylindrical with far smaller height than diameter) of the susceptor.

Since the susceptor is rather thin, the temperature difference between lower face and upper face is rather low (e.g. 50-100° C.), and the temperature of the susceptor can be schematically represented, in first approximation, with a radial diagram.

These position changes will typically take place under the control of a control system. During heating and before deposition, control of the position of the turns is preferably "open loop" and the electrical control of the inductor is preferably "open loop"; it is a simple control, but even better than the "closed loop" control for this application.

Preferably, during "open loop" control, the temperature can be measured for example by means of a thermographic camera. The control law can be for example stored in a table; each row corresponds to a different temperature (for example the average temperature of the substrate measured by the thermographic camera), for each temperature, an electrical power to be supplied to the inductor is provided as are, for example, vertical positions of the turns of the inductor. Starting from the first temperature (for example ambient temperature) the first power and the first positions are set; when the thermographic camera measures the second temperature, the second power and the second positions are set; and so on.

The data for the "open loop control" derive typically from one or more experimental campaigns. It has been observed that the best results are obtained when the position of the turns is modified according to an "experimental law".

The advantage of using an "open loop" control is that, from process to process, only the final temperature of the "process recipe" (which can be considered the "process temperature") changes at the thermal level in first approximation, and not the ramp to reach said temperature. Since a temperature ramp that is always identical to itself (or very similar) has to be realised, it is not worthwhile to include a "closed loop" control, which, by its nature, is excellent in managing ever different and unforeseen situations. In this way, through just one experimental campaign, it is possible to identify an optimal law, to obviate the problem of the thermal inertia of the susceptor and to avoid dangerous instabilities of the controlled system.

During epitaxial deposition processes (i.e. after the heating phase and before the cooling phase) it is preferable to operate in a different way.

During an epitaxial deposition process, the position of no turn of the inductor is modified, i.e. the position of each turn is maintained; the inductor is supplied electrical power by means of a "closed loop control".

During the "closed loop" control, the temperature can be measured for example by means of a thermographic camera, and the electrical power to be supplied to the inductor is calculated on the basis of the difference between the desired temperature (i.e. the process temperature for example set by the operator) and the temperature measured by the thermographic camera (for example the average temperature of the substrate).

In some applications, during the final part of the heating operation (e.g. during the last 50-100° C. of heating), it can be preferable to maintain the turn fixed and implement a "closed loop" electrical control of the inductor.

The invention claimed is:

1. A reactor for epitaxial deposition comprising at least one susceptor with a disk-like portion adapted to directly or indirectly support one or more substrates, and an inductor with turns adapted to heat said disk-like portion and to be controlled by changing the position of the turns, the reactor comprising:

a first motor adapted to change the position of at least one first turn of said inductor as a result of its motion, a first plurality of translating actuators adapted to act on a corresponding plurality of points of said at least one first turn and causing translations thereof, a first transmission (63) comprising one of a belt or a chain and adapted to transmit the motion of said first motor (61) to said first plurality of actuators (62), and potentiometers used to detect rotations of said actuators.

2. The reactor for epitaxial deposition according to claim 1, comprising:

a second motor adapted to change the position of at least one second turn of said inductor as a result of its motion, a second plurality of translating actuators adapted to act on a corresponding plurality of points of said at least one second turn and causing translations thereof, and a second transmission comprising one of a belt or a chain and adapted to transmit the motion of said second motor to said second plurality of actuators.

3. The reactor for epitaxial deposition according to claim 2, wherein said first transmission and/or said second transmission consists of two belts or chains.

4. The reactor for epitaxial deposition according to claim 1, wherein said inductor comprises a continuous conductor in a single elastic mechanical piece.

* * * * *